(12) United States Patent
Romanescu et al.

(10) Patent No.: US 9,530,770 B2
(45) Date of Patent: Dec. 27, 2016

(54) INTEGRATED CIRCUITS WITH RESISTOR STRUCTURES FORMED FROM GATE METAL AND METHODS FOR FABRICATING SAME

(71) Applicant: GLOBALFOUNDRIES, INC., Grand Cayman (KY)

(72) Inventors: Alexandru Romanescu, Dresden (DE); Gerd Zschätzsch, Dresden (DE); Christian Schippel, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 119 days.

(21) Appl. No.: 14/261,021

(22) Filed: Apr. 24, 2014

(65) Prior Publication Data

US 2015/0311272 A1 Oct. 29, 2015

(51) Int. Cl.
| | | |
|---|---|---|
| *H01L 21/20* | (2006.01) | |
| *H01L 27/06* | (2006.01) | |
| *H01L 49/02* | (2006.01) | |
| *H01L 29/66* | (2006.01) | |
| *H01L 29/78* | (2006.01) | |

(52) U.S. Cl.
CPC ......... *H01L 27/0629* (2013.01); *H01L 28/24* (2013.01); *H01L 29/665* (2013.01); *H01L 29/78* (2013.01)

(58) Field of Classification Search
CPC ....... H01L 28/00; H01L 27/2436; H01L 28/20
USPC .................................. 438/381–384
See application file for complete search history.

(56) References Cited

U.S. PATENT DOCUMENTS

| | | | |
|---|---|---|---|
| 8,815,679 B1* | 8/2014 | Yen | H01L 28/75 257/E21.021 |
| 2009/0090977 A1* | 4/2009 | Freeman | H01L 21/28088 257/379 |
| 2011/0062508 A1* | 3/2011 | Park | H01L 27/11526 257/316 |
| 2013/0168816 A1* | 7/2013 | Kang | H01L 28/24 257/536 |
| 2013/0200393 A1* | 8/2013 | Chen | H01L 27/0629 257/77 |

\* cited by examiner

*Primary Examiner* — Julia Slutsker
(74) *Attorney, Agent, or Firm* — Lorenz & Kopf, LLP

(57) ABSTRACT

Integrated circuits having resistor structures formed from gate metal and methods for fabricating such integrated circuits are provided. In an embodiment, a method for fabricating an integrated circuit includes providing a semiconductor substrate with a resistor area and a transistor area. The method deposits a gate metal over the resistor area and the transistor area of the semiconductor substrate, and the gate metal forms a gate metal layer in the resistor area. The method includes etching the gate metal to form a resistor structure from the gate metal layer in the resistor area. Further, the method includes forming contacts to the resistor structure in the resistor area.

13 Claims, 4 Drawing Sheets

INTEGRATED CIRCUITS WITH RESISTOR STRUCTURES FORMED FROM GATE METAL AND METHODS FOR FABRICATING SAME

TECHNICAL FIELD

The present disclosure generally relates to integrated circuits having resistor structures and methods for fabricating such integrated circuits, and more particularly relates to integrated circuits having resistor structures formed from gate metal and methods for fabricating such integrated circuits.

BACKGROUND

Conventional resistors typically include doped polycrystalline silicon (polysilicon) resistive elements patterned to form a desired geometry. Contacts are formed at opposite ends of each doped polysilicon resistive element, such as from patterned silicide patches. The contacts define a conductive path to the doped polysilicon resistive elements and facilitate integration of the resistor with other semiconductor structures.

Resistors formed from doped polysilicon resistive elements typically suffer from high variability in resistance. For example, the resistance of resistors formed from doped polysilicon resistive elements may vary because of non-uniform hydrogen penetration into the polysilicon. Further, the resistance may vary due to the non-uniformity of doping processes. The resistance variability of resistors is a key concern in analog and digital circuit design.

Conventionally-formed polysilicon resistors may take up a relatively large area of a semiconductor substrate of an integrated circuit. As the critical dimensions of integrated circuits continue to shrink, the area of a semiconductor substrate or "footprint" available for forming resistor structures is reduced. Nevertheless, circuit designs may require a high resistance resistor or low resistance resistor formed in a relatively small footprint of semiconductor substrate.

Accordingly, it is desirable to provide integrated circuits and methods for fabricating integrated circuits having resistor structures with improved uniformity of resistance. Also, it is desirable to provide integrated circuits and methods for fabricating integrated circuits with resistor structures formed from a material other than polysilicon, i.e., gate metal. Further, it is desirable to provide integrated circuits and methods for fabricating integrated circuits with resistor structures having effective lengths or widths greater than the respective length or width of the provided semiconductor substrate footprint. Furthermore, other desirable features and characteristics will become apparent from the subsequent detailed description and the appended claims, taken in conjunction with the accompanying drawings and the foregoing technical field and background.

BRIEF SUMMARY

Integrated circuits having resistor structures formed from gate metal and methods for fabricating such integrated circuits are provided. In accordance with one embodiment, a method for fabricating an integrated circuit includes providing a semiconductor substrate with a resistor area and a transistor area. The method deposits a gate metal over the resistor area and the transistor area of the semiconductor substrate, and the gate metal forms a gate metal layer in the resistor area. The method includes etching the gate metal to form a resistor structure from the gate metal layer in the resistor area. Further, the method includes forming contacts to the resistor structure in the resistor area.

In another embodiment, a method for fabricating an integrated circuit includes providing a semiconductor substrate with a resistor area and a transistor area and forming a trench in the resistor area. The method deposits a gate metal over the semiconductor substrate and in the trench. The method further etches the gate metal to form a resistor structure in the resistor area and to form a gate structure in the transistor area. The method includes forming contacts to the resistor structure in the resistor area.

In accordance with another embodiment, an integrated circuit is provided. The integrated circuit includes a semiconductor substrate with a resistor area and a transistor area. A trench having sidewalls is defined in the resistor area. The integrated circuit includes a gate structure formed from a gate metal in the transistor area. Further, the integrated circuit includes a resistor structure formed from the gate metal in the resistor area. The gate metal includes non-planar portions formed along the sidewalls of the trench in the resistor area.

BRIEF DESCRIPTION OF THE DRAWINGS

Embodiments of integrated circuits having resistor structures formed from gate metal and methods for fabricating such integrated circuits will hereinafter be described in conjunction with the following drawing figures, wherein like numerals denote like elements, and wherein.

DETAILED DESCRIPTION

The following detailed description is merely exemplary in nature and is not intended to limit the various embodiments of the integrated circuits or the methods for fabricating integrated circuits claimed herein. Furthermore, there is no intention to be bound by any expressed or implied theory presented in the preceding technical field, background or brief summary, or in the following detailed description.

Integrated circuits and methods for fabricating integrated circuits as described herein avoid issues faced in conventional processes. For example, the exemplary integrated circuits and methods for fabricating integrated circuits provide resistor structures having substantially uniform resistances. Specifically, exemplary embodiments herein provide resistor structures formed from gate metal. Such gate metal may be conformally deposited with high precision to a desired uniform thickness, and precisely etched or otherwise patterned to a selected shape. As a result, the resistor structures exhibit improved resistance uniformity as compared to conventional resistors.

Further, embodiments of the integrated circuits and methods for fabricating integrated circuits described herein may provide for economical use of semiconductor substrate footprint. Specifically, an exemplary resistor structure is non-planar and has a design resistor length that extends from a first resistor end to a second resistor end. Due to its non-planar layout, as described below, the exemplary resistor structure has an effective resistor length greater than the design resistor length. As a result, a resistor structure may be formed with greater resistance than typically attainable with a planar resistor in a small length footprint. Another exemplary non-planar resistor structure has a design resistor width that extends from a first resistor edge to a second resistor edge, and has an effective resistor width greater than the design resistor width. As a result, a resistor structure may be formed with a lower resistance than typically attainable with a planar resistor in a small width footprint.

Figure 5:
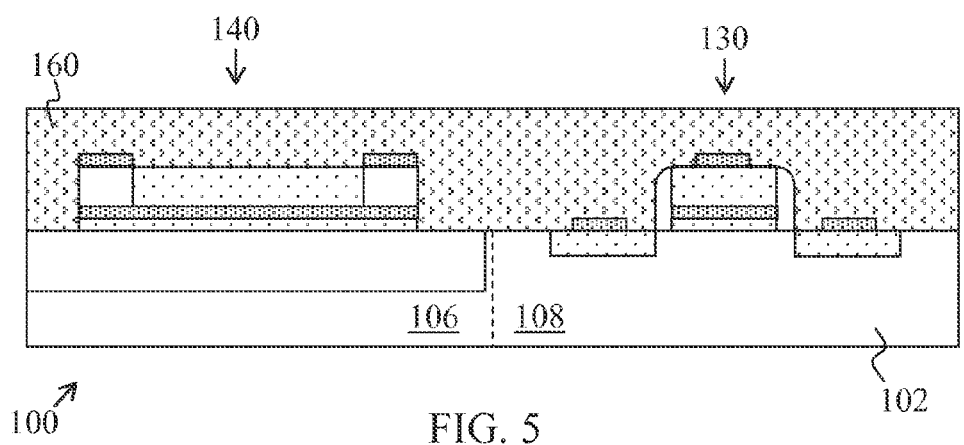
Figure 6:
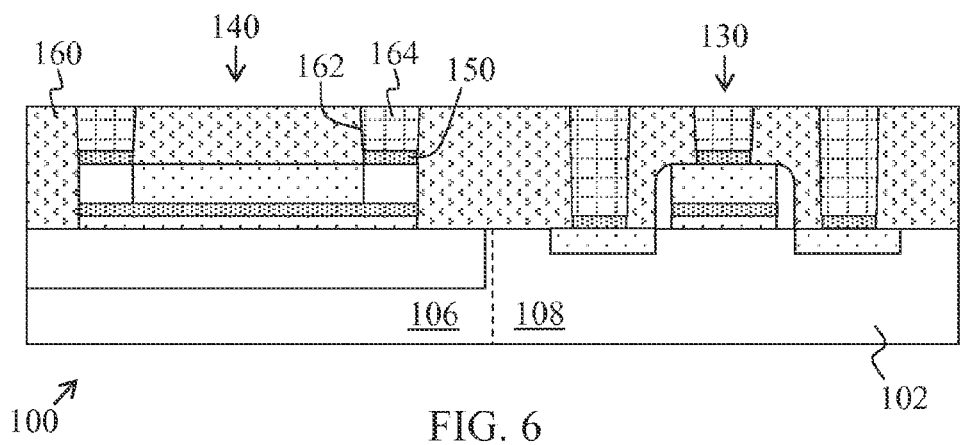
Figure 7:
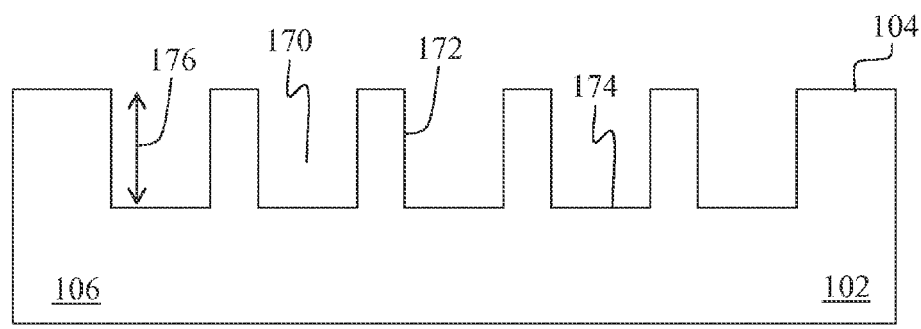
FIGS. 7-9 are cross-sectional views illustrating the resistor area of the integrated circuit of FIGS. 1-6 and method steps for fabricating the integrated circuit with a non-planar resistor structure in accordance with various embodiments herein.
Figure 8:
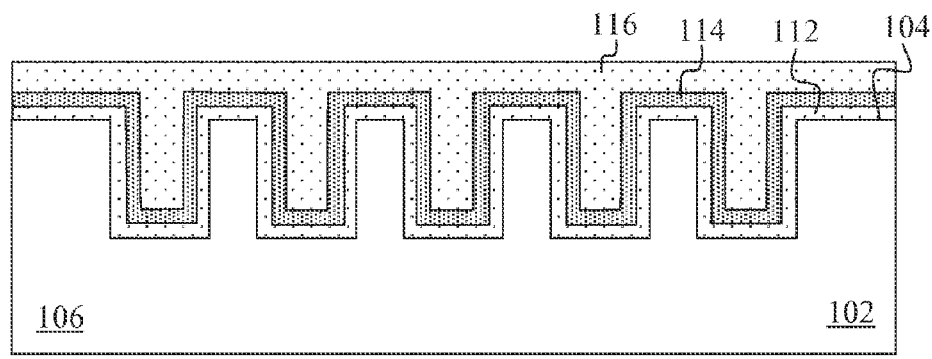
Figure 9:
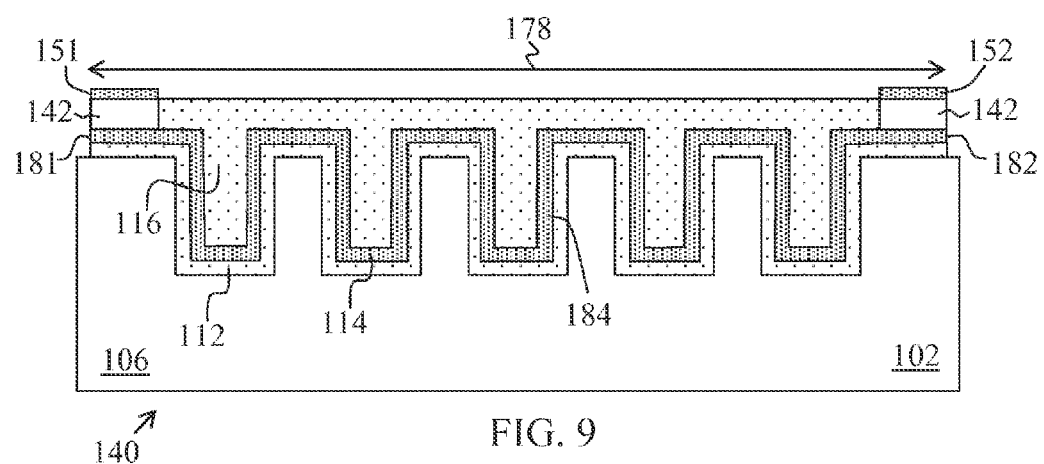
Figure 10:
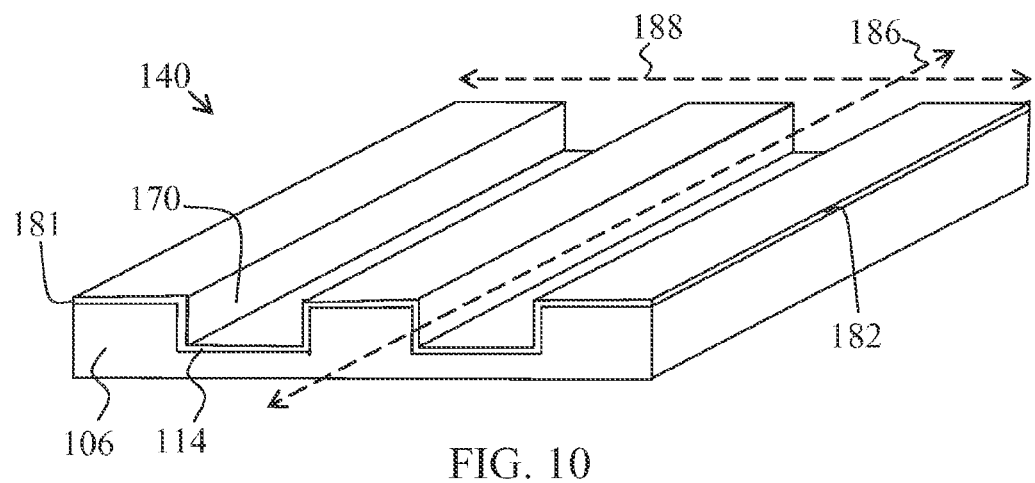
FIGS. 10 and 11 are perspective views illustrating configurations of non-planar resistor structures formed in accordance with various embodiments herein.
Figure 11:
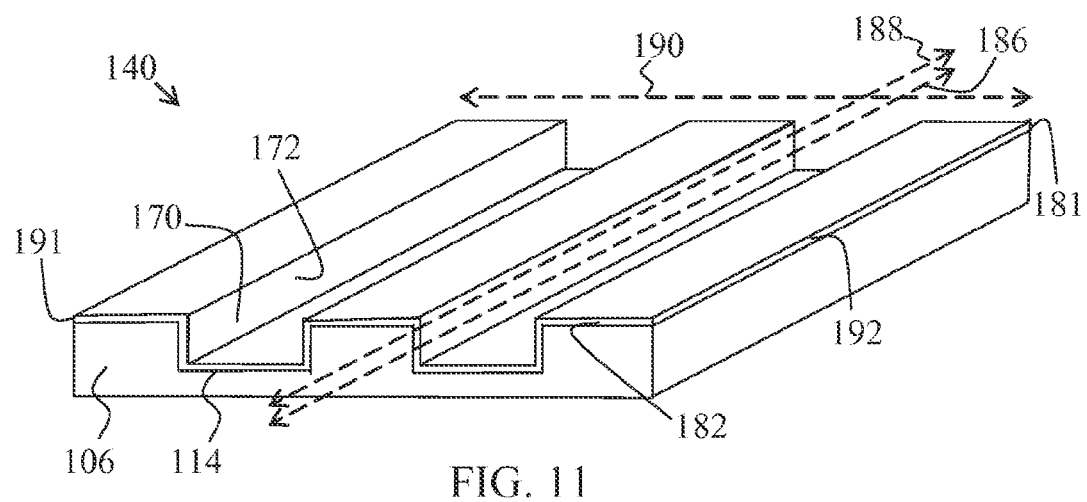

FIGS. 1-11 illustrate steps in accordance with various embodiments of methods for fabricating integrated circuits. Specifically, FIGS. 1-6 illustrate the concurrent formation of a resistor structure and a transistor structure from a gate metal layer, while FIGS. 7-9 show details related to the formation of a non-planar resistor structure from the gate metal layer. FIG. 10 illustrates a non-planar resistor structure having an effective resistor length greater than its design resistor length. FIG. 11 illustrates a non-planar resistor structure having an effective resistor length greater than its design resistor length. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components, such as resistors and transistors, and that single components shown in the illustrations may be representative of multiple components.

Figure 1:
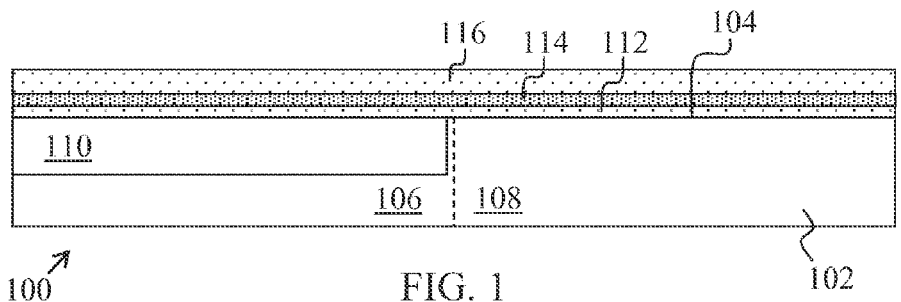
FIGS. 1-6 are cross-sectional views illustrating a portion of an integrated circuit and a method for fabricating the integrated circuit with a resistor formed from gate metal in accordance with various embodiments herein.

In FIG. 1, an integrated circuit 100 is illustrated during formation of a transistor device and a resistor structure. As shown, the partially fabricated integrated circuit 100 includes a semiconductor substrate 102. The semiconductor substrate 102 is a suitable semiconductor material as typically used in the semiconductor industry, e.g., relatively pure silicon or silicon admixed with other elements such as germanium, carbon, and the like. Alternatively, the semiconductor material can be germanium, gallium arsenide, or the like. The semiconductor material may be provided as a bulk semiconductor substrate, or it could be provided on a silicon-on-insulator (SOI) substrate, which includes a support substrate, an insulator layer on the support substrate, and a layer of silicon material on the insulator layer. Alternatively, the semiconductor substrate 102 may include a compound semiconductor such as silicon carbide, gallium arsenide, indium arsenide, or indium phosphide. Further, the semiconductor substrate 102 may optionally include an epitaxial layer. Also, the semiconductor substrate 102 may be in the form of fin structures for use in a FinFET. As shown, the semiconductor substrate 102 is provided with a substantially planar upper surface 104. Further, the semiconductor substrate 102 includes a resistor area 106 and a transistor area 108.

As shown in FIG. 1, an isolation region 110 may be formed in the resistor area 106 of the semiconductor substrate 102. The isolation region 110 may provide for electrical isolation of a later-formed resistor structure in the resistor area 106 from a later-formed transistor structure in the transistor area 108. In an exemplary embodiment, the isolation region 110 is silicon oxide, and may be commonly referred to as field oxide. In an exemplary embodiment, the isolation region 110 is formed by performing shallow trench isolation (STI) on the semiconductor substrate 102. The isolation region 110 may be formed in a conventional manner, for example, by forming a masking material, such as a silicon nitride material (e.g., pad nitride), overlying the semiconductor substrate 102, patterning the masking material to leave an exposed portion of the underlying semiconductor substrate 102, etching a trench into the exposed portion of the semiconductor substrate 102 using the masking material as an etch mask, and forming insulating material in the trench. In an exemplary process, the insulating material is formed in the trench by conformably depositing a layer of an oxide material, such as silicon dioxide, to a thickness greater than the depth of the trench relative to the upper surface 104 of the semiconductor substrate 102. After forming the insulating material in the trench, chemical-mechanical planarization (CMP) may be used to remove any insulating material over the upper surface 104 of the semiconductor substrate 102 and to obtain a substantially planar surface, resulting in the structure of FIG. 1. It should be appreciated that although the subject matter is described herein in the context of shallow trench isolation, in practice, isolation region 110 may be formed using another isolation process (e.g., local oxidation of silicon) known in the art.

After formation of the isolation region 110, a dielectric layer 112 such as a dielectric layer formed from high dielectric constant (high-k) dielectric material is formed overlying the semiconductor substrate 102. As used herein, "overlying" means "on" and "over". In this regard, the dielectric layer 112 may lie directly on the semiconductor substrate 102 such that it makes physical contact with the semiconductor substrate 102 or it may lie over the semiconductor substrate 102 such that another material layer is interposed between the semiconductor substrate 102 and the dielectric layer 112. Also, as used herein "high-k" dielectric materials are insulating materials having a dielectric constant greater than silicon dioxide. An exemplary high-k dielectric may be a high-k dielectric suitable for forming a gate dielectric, for example, a metal oxide such as hafnium oxide ($HfO_2$), zirconium oxide ($ZrO_2$), or the like. In an exemplary embodiment, the dielectric layer 112 is formed by, for example, employing a physical vapor deposition (PVD) process, a chemical vapor deposition (CVD) process, or another suitable deposition process as known in the art.

As shown in FIG. 1, a gate metal layer 114 is formed overlying gate dielectric layer 112. Gate metal layer 114 can be, for example, molybdenum (Mo), ruthenium (Ru), tantalum carbide nitride (TaCN), tantalum nitride (TaN), titanium nitride (TiN), or other gate metals suitable for utilization in a transistor gate structure. Gate metal layer 114 can be configured to form a resistive element of at least one resistor stack (described further below) having, for example, a characteristic sheet resistance of from about 500 to about 1000 ohms per square ($\Omega$/sq). Concurrently, gate metal layer 114 can be processed to form a conductive gate portion for at least one transistor gate stack as described below. An exemplary gate metal layer 114 has a thickness of from about 1.5 to about 5 nanometers (nm). The gate metal layer 114 may be formed overlying the gate dielectric layer 112 by, for example, employing a physical vapor deposition (PVD) process, a chemical vapor deposition (CVD) process, or other suitable deposition process as known in the art. The gate metal layer 114 is provided with highly uniform resistance through its inherent compositional uniformity and the uniformity of thickness when deposited.

In the exemplary embodiment, a gate material 116 is deposited overlying the gate metal layer 114. An exemplary gate material 116 is un-doped polycrystalline silicon, though other appropriate gate materials may be used. In an exemplary process, the gate material 116 is deposited by employing a low pressure chemical vapor deposition (LPCVD) process or other suitable deposition process as known in the art. An exemplary gate material 116 has a thickness of from about 30 to about 70 nm.

Figure 2:
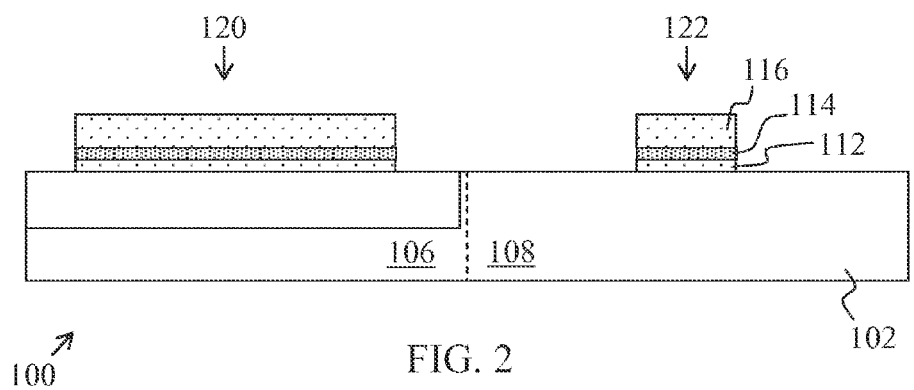

In FIG. 2, the exemplary method may continue by etching the gate material 116, gate metal layer 114, and dielectric layer 112 to form stacks, for example, resistor stack 120 and gate stack 122. Specifically, a mask may be formed and patterned over the gate material 116 to expose portions of the gate material 116, gate metal layer 114, and dielectric layer 112. The exposed portions of gate material 116, gate metal layer 114, and dielectric layer 112 can be concurrently removed in one step or sequentially in more than one step. In either case, the respective stacks can be formed without requiring additional processing steps with respect to a typical transistor fabrication process. Resistor stack 120 can be formed so that metal layer 114 in resistor stack 120 exhibits a geometry corresponding to a desired total effective resistance for a completed integrated resistor. Specifically, resistor stack 120 can be formed with a selected length and selected width and be non-planar, as discussed in relation to FIGS. 7-9 below.

Figure 3:
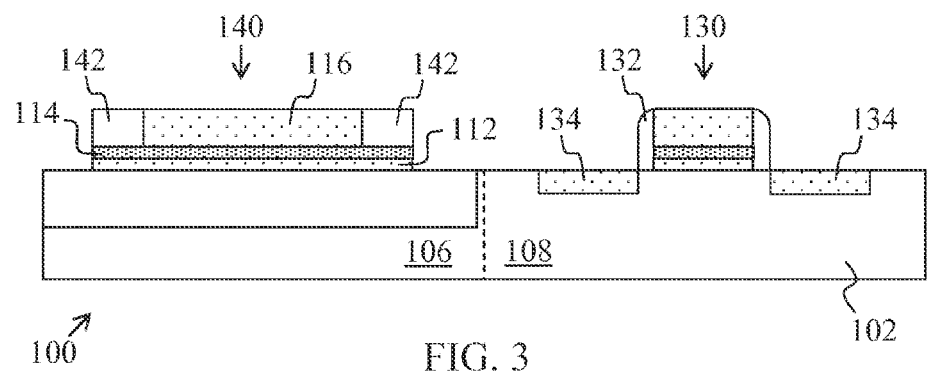

The method may continue in FIG. 3 with further processing of the gate stack 122 and semiconductor substrate 102 adjacent the gate stack 122 to form a transistor gate structure 130 having desired characteristics. Such processing may be performed according to conventional techniques and may include forming spacers 132, masking, and doping through selective ion implantation to form source/drain regions 134, including for example halo, extension, and deep implant regions. An exemplary transistor gate structure 130 is shown in FIG. 3, along with source/drain regions 134 surrounding the transistor gate structure 130.

During an exemplary process for forming the transistor gate structure 130 in FIG. 3, the resistor stack 120 is concurrently processed to form resistor structure 140. Specifically, the masking process used to expose regions of the semiconductor substrate 102 around the spacers 132 for forming source/drain regions 134 is used to expose portions of the gate material 116 in resistor stack 120. Then, selected implant processes used to form the source/drain regions 134 in the transistor area 108 can be used to dope the exposed gate material 116 in resistor stack 120 to form conductive doped regions 142. Exemplary implant processes may use implant species such as As, P, B, $BF_2$, F, N or combinations thereof. The conductive doped regions 142 provide the resistor structure 140 with an electrical path through the conductive doped regions 142 and the gate metal layer 114, while the dielectric layer 112 and the remaining undoped region of the gate material 116 are insulative.

Figure 4:
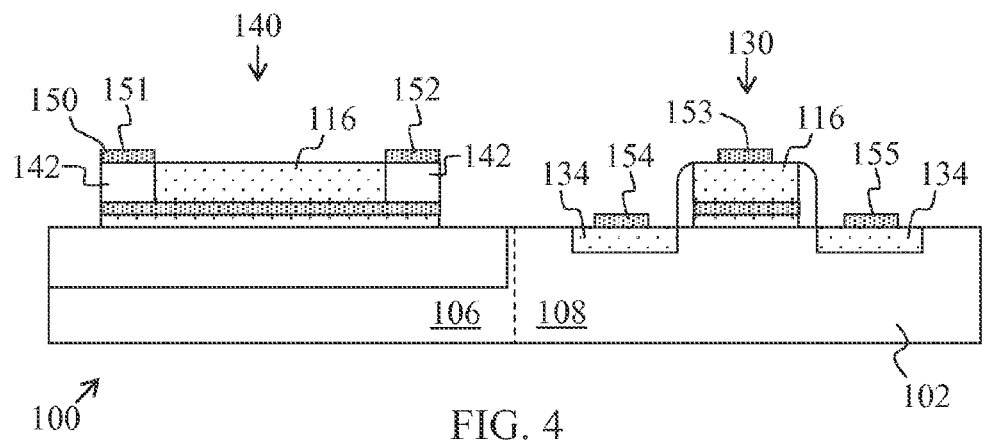

In FIG. 4, the exemplary method includes the formation of contacts 150. Contact formation may be performed with conventional masking, deposition and silicidation steps. For example, a masking material may be deposited over the resistor area 106 and the transistor area 108 and etched to expose desired locations for contacts. For example, the conductive doped regions 142, the gate material 116 in the transistor gate structure 130, and the source/drain regions 134 may be selectively exposed. Thereafter, a silicide-forming metal material is deposited over the mask and the exposed locations. The metal material may be deposited by chemical vapor deposition (CVD), physical vapor deposition (PVD), atomic layer deposition (ALD), or any combination thereof. Exemplary metal materials include nickel (Ni), cobalt (Co), titanium (Ti), platinum (Pt), rare earth metals (e.g., Erbium (Er), Ytterbium (Yt), etc.), silicides (or germanides) of these materials, or an alloy or any combination thereof. An exemplary metal material is formed with a thickness of from about 1 to 10 nm. An anneal may then be performed to form silicide (or germanide) contacts 150 resulting from the reaction of the metal material and the semiconductor material of the contact location. As shown, the contacts 150 include contacts 151 and 152 formed on conductive doped portions 142 of the gate material 116 in the resistor structure 140, contact 153 formed on the gate material 116 in the transistor gate structure 130, and contacts 154 and 155 formed on the source/drain regions 134.

As shown in FIG. 5, the exemplary method may continue with the deposition of an interlayer dielectric material 160 over the resistor structure 140 and the transistor gate structure 130. The interlayer dielectric material 160 may include more than one layer of dielectric material. An exemplary interlayer dielectric material 160 is silicon oxide. In an exemplary process, the interlayer dielectric material 160 is blanket deposited. In FIG. 6, the interlayer dielectric material 160 is etched and trenches 162 are formed to expose the contacts 150. For example, a masking material may be deposited and patterned over the dielectric material, and the exposed regions of the interlayer dielectric material 160 may be anisotropically etched to form the trenches 162. Thereafter, a barrier layer, such as titanium nitride and/or tantalum nitride, and a conductive fill metal, such as copper, may be sequentially deposited to fill the trenches 162 to form conductive vias 164. Any overburden portion of the barrier layer or conductive fill metal may be removed by chemical-mechanical planarization (CMP).

FIGS. 1-6 illustrate the concurrent formation of a resistor structure 140 and a transistor gate structure 130 from the gate dielectric layer 112, gate metal layer 114, and gate material 116. FIGS. 7-9 illustrate the same processing steps in relation to the resistor area 106, but provide for the formation of a non-planar resistor structure 140. Specifically, in FIG. 7, the resistor area 106 of the semiconductor substrate 102 in FIG. 1 is etched to form trenches 170 before the formation of layers 112 and 114 shown in FIG. 1. The trenches have opposite sidewalls 172 and bottom walls 174. The sidewalls 172 have a length (and the trenches 170 have a depth) indicated by double-headed arrow 176. In other words, the bottom walls 174 are distanced from the upper surface 104 of the semiconductor substrate 102 by the distance 176. In the exemplary embodiment, the trenches 170 are formed in the semiconductor substrate 102; however, they may be formed in the isolation region 110 of FIG. 1, if used.

FIG. 8 illustrates the resistor area 106 after the formation of dielectric layer 112, gate metal layer 114 and gate material 116, as previously described in relation to FIG. 1. As shown in FIG. 8, the dielectric layer 112 is conformally deposited to a uniform thickness over the upper surface 104, the trench sidewalls 172, and the trench bottom walls 174. Likewise, the gate metal layer 114 is conformally deposited overlying the dielectric layer 112 to a uniform thickness over the upper surface 104, the trench sidewalls 172, and the trench bottom walls 174. The gate material 116 fills the trenches 170 and forms a planar upper surface.

In FIG. 9, the gate material 116, gate metal layer 114, and gate dielectric layer 112 are etched, as described previously in relation to FIG. 2, to form the resistor stack. Further, conductive doped regions 142 are formed through ion implantation as discussed in relation to FIG. 3. Also, contacts 151 and 152 are formed on the conductive doped regions 142 as previously described in FIG. 4.

As shown in FIG. 9, the resistor structure 140 has a length indicated by double-headed arrow 178. The length 178 extends from a first end 181 of the gate metal layer 114 adjacent contact 151 to a second end 182 adjacent contact 152. The length 178 may be considered to be the "design resistor length" of the resistor structure 140. Specifically, length 178 is the length of semiconductor substrate 102 that the resistor structure 140 lies over. As shown, the length of the conductive path from the first end 181 to the second end 182 of the gate metal layer 114, e.g., the "effective resistor length", is greater than the design resistor length. Specifically, in the exemplary embodiment of FIG. 9, the conductive path defined by the non-planar gate metal layer 114 travels into and out of five trenches. Thus, the non-planar gate metal layer 114 includes ten vertical portions 184 adjacent the trench sidewalls. Each vertical portion 184 of the non-planar gate metal layer 114 has a length substantially equal to distance 176 (see FIG. 7). Therefore, the effective resistor length is equal to ten times the distance 176 plus the length 178 ($10*D_{176}+L_{178}$).

FIG. 10 provides a perspective view of a non-planar gate metal layer 114 lying over a resistor area 106. While not illustrated, the dielectric layer 112 may be positioned between the gate metal layer 114 and the resistor area 106. As shown, the resistor area 106 is formed with three trenches 170. Each trench 170 extends in the direction of a trench axis 186. The gate metal layer 114 extends from first end 181 to second end 182 in the direction of axis 188. As shown, axis 188 is substantially perpendicular to axis 186. The arrangement of FIG. 10 (and FIGS. 7-9) provides for formation of contacts at the resistor ends 181 and 182 and provides a resistor structure having an effective resistor length (from end 181 to end 182) that is greater than the design resistor length (in the direction of axis 188). Such a configuration provides the ability to form a resistor having a greater resistance than otherwise provided by a planar resistor with a limited design resistor length.

In FIG. 11 the configuration of the resistor structure 140 is rotated 90 degrees. The gate metal layer 114 extends from first end 181 to second end 182 in the direction of axis 188. However, axis 188 is parallel (or coincident) with the trench axis 186. With this configuration and formation of contacts at the resistor ends 181 and 182, the effective resistor length (from end 181 to end 182) of gate metal layer 114 is equal to the design resistor length (in the direction of axis 188). As shown, the gate metal layer 114 also extends from a first edge 191 to a second edge 192 in the direction of axis 190. Axis 190 is substantially perpendicular to trench axis 186. The resistor structure 140 has a width along axis 190. As axis 190 is perpendicular to the trench axis 186, the gate metal layer 114 defines a non-planar path from first edge 191 to second edge 192 including vertical portions along trench sidewalls. As a result, the effective resistor width (from edge 191 to edge 192) is greater than the design resistor width (in the direction of axis 190). Such a configuration provides the ability to form a resistor having less resistance than otherwise provided by a planar resistor with a limited design resistor width.

After formation of the partially fabricated integrated circuit according to methods herein, further processing may be performed to complete the integrated circuit 100. For example, back-end-of-line processing may form interconnects between devices on the semiconductor substrate 102. While FIGS. 1-11 have illustrated single resistors, it is envisioned that resistors according to various embodiments may be formed in a single integrated circuit. By using a gate metal layer to form the conductive path of a resistor, the process described herein is compatible with multiple high-k metal gate processes for advanced process technologies. Consequently, by forming at least one integrated resistor in at least one region of a substrate while concurrently forming at least one gate stack in another region of a substrate, an integrated resistor is formed without requiring additional masks or process steps beyond those required to form the gate stacks. Embodiments herein provide integrated circuits with improved resistors that can be fabricated with no additional processing steps. Additionally, because embodiments provide integrated circuits with resistors having effective resistor lengths greater than design resistor lengths, flexibility is provided in the design of integrated circuits, which can lead, for example, to advantageous reductions in device size.

As described above, fabrication processes may be implemented to form integrated circuits with resistors formed from gate metal. Further, resistors are formed with greater resistance uniformity. The processes described can provide for non-planar resistors having higher or lower resistance than planar resistors provided with limited resistor design length and/or resistor design width. Benefits from decreased resistance resistors include allowing the formation of integrated circuits with resistors having relatively low total effective resistances without requiring multiple integrated resistors connected in parallel, thereby advantageously reducing the semiconductor substrate footprint required to implement a relatively low total effective resistance.

To briefly summarize, the fabrication methods described herein result in integrated circuits with improved resistor uniformity and performance. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   providing a semiconductor substrate with a resistor area and a transistor area;
   depositing a gate metal over the resistor area and the transistor area of the semiconductor substrate, wherein the gate metal forms a gate metal layer in the resistor area;
   depositing a gate material over the gate metal;
   etching the gate metal layer and the gate material to form a resistor structure from the gate metal layer in the resistor area; and
   selectively doping regions of the gate material over the resistor structure to form a first doped conductive region and a second doped conductive region, wherein an undoped region of the gate material insulates the first doped conductive region from the second doped conductive region.

2. The method of claim 1 wherein depositing the gate metal over the resistor area and the transistor area of the semiconductor substrate forms a non-planar gate metal layer in the resistor area, wherein etching the gate metal forms a non-planar resistor structure from the non-planar gate metal layer in the resistor area having a first end and a second end.

3. The method of claim 1 wherein depositing the gate material over the gate metal comprises depositing polycrystalline silicon over the gate metal.

4. The method of claim 1 further comprising forming a first contact to the resistor structure in the resistor area through the first conductive region and forming a second contact to the resistor structure in the resistor area through the second conductive region.

5. The method of claim 1 wherein depositing the gate metal over the resistor area and the transistor area of the semiconductor substrate comprises defining a cavity bound by a first sidewall and a second sidewall formed by the gate metal layer in the resistor area, wherein depositing the gate material over the gate metal comprises filling the cavity in the resistor area with the gate material, and wherein the undoped region of the gate material separates the first sidewall from the second sidewall.

6. The method of claim 5 wherein the cavity is bound by the first sidewall, the second sidewall and a bottom portion of the gate metal layer extending between the first sidewall and the second sidewall, wherein the bottom portion of the gate metal layer forms a conductive path between the first sidewall and the second sidewall, and wherein the undoped region of the gate material insulates the first sidewall from the second sidewall.

7. A method for fabricating an integrated circuit, the method comprising:
providing a semiconductor substrate with a resistor area and a transistor area;
forming a first trench in the resistor area, wherein the first trench includes a first sidewall and an opposite second sidewall distanced from the first sidewall by a first trench bottom surface;
forming a second trench in the resistor area, wherein the second trench includes a third sidewall and an opposite fourth sidewall distanced from the third sidewall by a second trench bottom surface, and wherein the third sidewall is separated from the second sidewall by an inter-trench portion of the semiconductor substrate;
depositing a layer of gate metal over the semiconductor substrate, in the first trench, and in the second trench;
etching the layer of gate metal to form a continuous segment of gate metal extending adjacent the first sidewall, first trench bottom surface, and second sidewall of the first trench, over the inter-trench portion and adjacent the third sidewall, second trench bottom surface, and fourth sidewall of the second trench in the resistor area to define a resistor structure, and to form a gate structure in the transistor area; and
forming contacts to the resistor structure in the resistor area.

8. The method of claim 7 wherein the resistor structure has a first end and a second end distanced from the first end in a longitudinal direction, wherein forming contacts to the resistor structure in the resistor area comprises forming a first contact to the first end and a second contact to the second end, and wherein the first sidewall, second sidewall, third sidewall and fourth sidewall are planar and are perpendicular to the longitudinal direction.

9. The method of claim 7 wherein the resistor structure has a first end and a second end distanced from the first end in a longitudinal direction, wherein forming contacts to the resistor structure in the resistor area comprises forming a first contact to the first end and a second contact to the second end, and wherein the first sidewall, second sidewall, third sidewall and fourth sidewall are planar and are parallel to the longitudinal direction.

10. The method of claim 7 wherein:
the inter-trench portion is a first inter-trench portion;
the method further comprises forming a third trench in the resistor area;
the third trench includes a fifth sidewall and an opposite sixth sidewall distanced from the fifth sidewall by a third trench bottom surface;
the fifth sidewall is separated from the fourth sidewall by a second inter-trench portion of the semiconductor substrate;
depositing the layer of gate metal comprises depositing the layer of gate metal in the third trench; and
etching the layer of gate metal comprises forming the continuous segment of gate metal extending over the second inter-trench portion and adjacent the fifth sidewall, third trench bottom surface, and sixth sidewall of the third trench in the resistor area to define the resistor structure.

11. The method of claim 7 wherein the semiconductor substrate has an upper surface, and wherein the continuous segment of gate metal includes:
a first horizontal planar portion over the upper surface of the semiconductor substrate adjacent the first trench;
a first vertical planar portion adjacent the first sidewall;
a second horizontal planar portion over the first trench bottom surface;
a second vertical planar portion adjacent the second sidewall;
a third horizontal planar portion over the upper surface of the inter-trench portion of the semiconductor substrate;
a third vertical planar portion adjacent the third sidewall;
a fourth horizontal planar portion over the second trench bottom surface; and
a fourth vertical planar portion adjacent the fourth sidewall.

12. The method of claim 7 wherein:
forming contacts to the resistor structure in the resistor area comprises forming a first contact to a first end of the continuous segment of gate metal and forming a second contact to a second end of the continuous segment of gate metal;
the first end and the second end of the continuous segment are separated by a distance along an axis; and
each vertical planar portion is parallel to the axis.

13. The method of claim 7 wherein:
forming contacts to the resistor structure in the resistor area comprises forming a first contact to a first end of the continuous segment of gate metal and forming a second contact to a second end of the continuous segment of gate metal;
the first end and the second end of the continuous segment are separated by a distance along an axis; and
each vertical planar portion is perpendicular to the axis.

* * * * *